United States Patent
Zhang

(10) Patent No.: US 9,129,910 B2
(45) Date of Patent: Sep. 8, 2015

(54) WAFER PROCESSING

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/032,203

(22) Filed: Sep. 20, 2013

(65) Prior Publication Data

US 2015/0087132 A1    Mar. 26, 2015

(51) Int. Cl.
   H01L 21/31      (2006.01)
   H01L 21/311     (2006.01)
   H01L 21/302     (2006.01)
   H01L 21/469     (2006.01)
   H01L 21/762     (2006.01)

(52) U.S. Cl.
   CPC .... H01L 21/31116 (2013.01); H01L 21/76224 (2013.01)

(58) Field of Classification Search
   CPC ... H01L 21/324; H01L 21/762; H01L 21/311; H01L 21/021
   USPC .................. 438/14, 424, 218, 425, 477, 694; 257/E21.249, E21.546, E21.549
   See application file for complete search history.

(56) References Cited

U.S. PATENT DOCUMENTS

| | | | |
|---|---|---|---|
| 5,296,385 A | | 3/1994 | Moslehi et al. |
| 5,607,543 A | * | 3/1997 | Eisenberg et al. ............ 438/751 |
| 5,837,378 A | * | 11/1998 | Mathews et al. .............. 438/439 |
| 6,025,250 A | * | 2/2000 | Ha et al. ........................ 438/459 |
| 7,064,072 B1 | * | 6/2006 | Ting et al. ..................... 438/700 |
| 2008/0108223 A1 | * | 5/2008 | Wang et al. ................... 438/700 |
| 2009/0032935 A1 | | 2/2009 | Bhowmik et al. |
| 2009/0197355 A1 | * | 8/2009 | Terahara ......................... 438/14 |
| 2011/0201172 A1 | * | 8/2011 | Chew et al. ................... 438/424 |
| 2012/0007199 A1 | * | 1/2012 | Li et al. ......................... 257/432 |
| 2012/0313170 A1 | * | 12/2012 | Chang et al. .................. 257/347 |
| 2014/0103429 A1 | | 4/2014 | Chuang et al. |

* cited by examiner

*Primary Examiner* — Kimberly Rizkallah
*Assistant Examiner* — Brian Turner
(74) *Attorney, Agent, or Firm* — Horizon IP Pte. Ltd.

(57) ABSTRACT

Semiconductor device and method for forming a semiconductor device are presented. A substrate having top and bottom pad stacks is provided. Each pad stack includes at least first and second pad layers. The second pad layer of the bottom pad stack is removed by a batch process. Trench isolation regions are formed in the substrate.

19 Claims, 8 Drawing Sheets

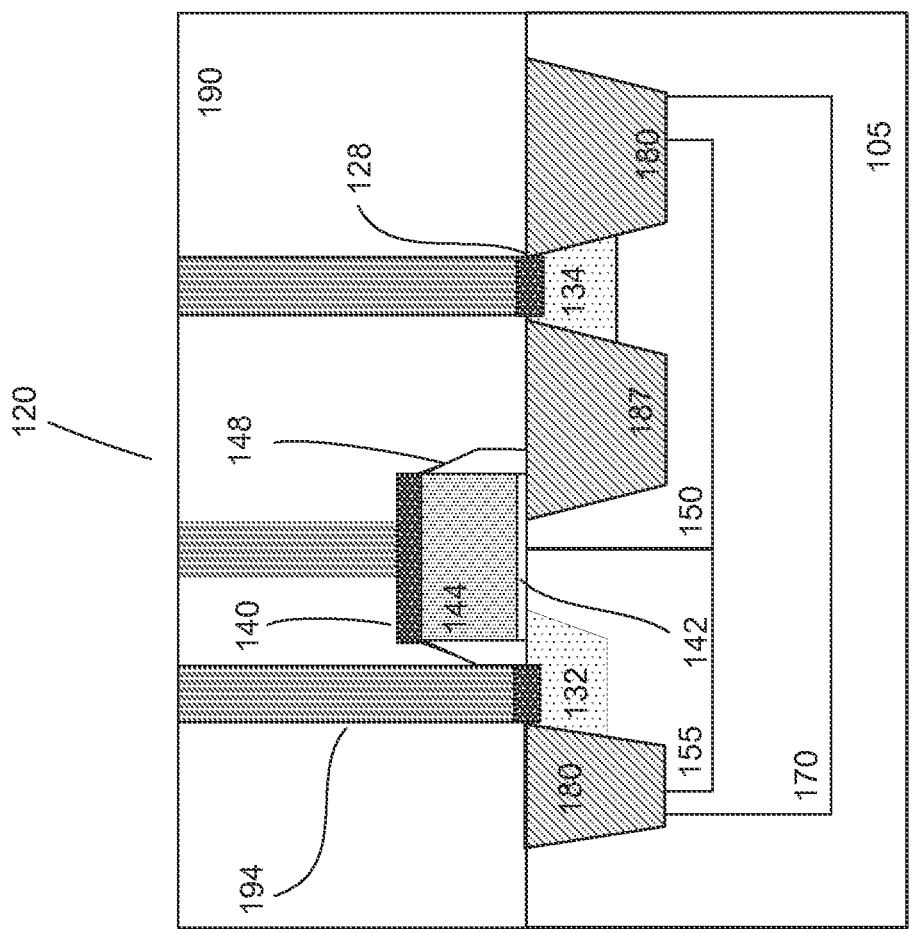
Fig. 1
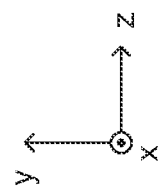

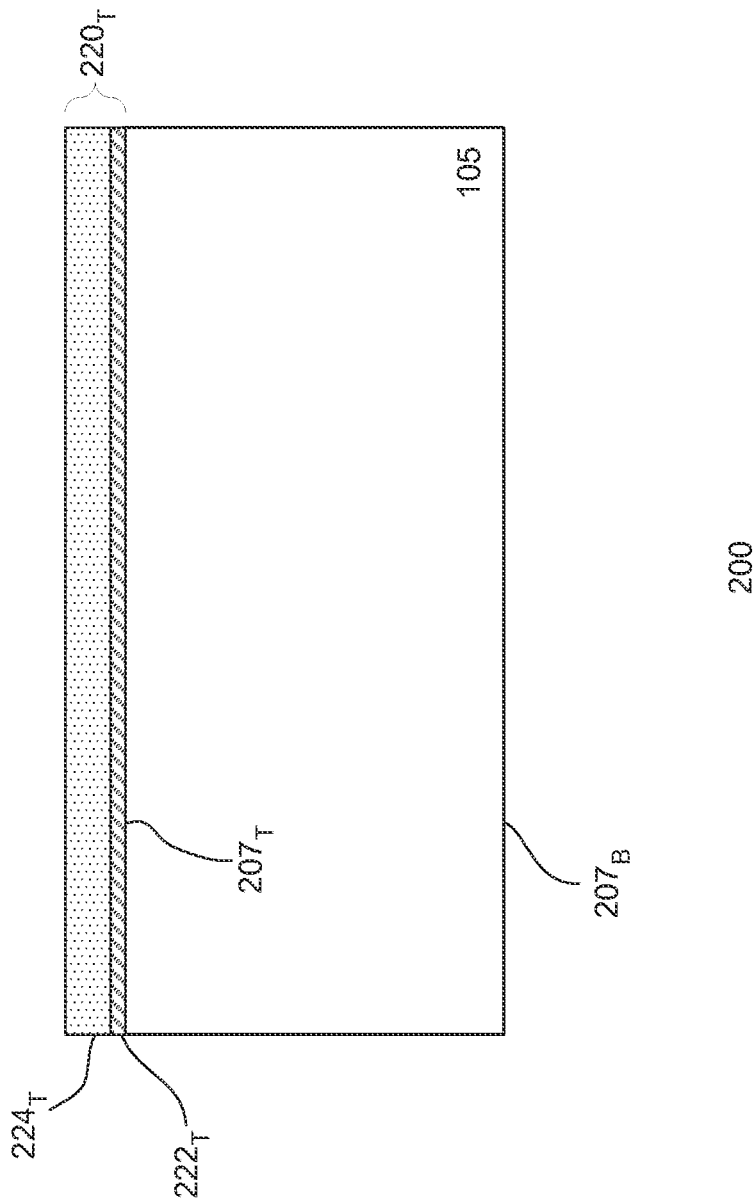

WAFER PROCESSING

CROSS-REFERENCE

This application is concurrently filed with application Ser. No. 14/032,206 entitled "Wafer Processing", which is herein incorporated by reference for all purposes.

BACKGROUND

Formation of deep junction, particularly, for high voltage applications, requires high temperature and long thermal drive in process. The high temperature and long thermal drive in process, however, may lead to wafer warpage. To alleviate the thermal stress created during the drive in process, removal of pad nitride film on the backside of the wafer before the drive in process is desired. However, current pad nitride removal process requires long processing times. This leads to low throughput and higher manufacturing cost.

Therefore, it is desirable to provide an efficient and simplified method for wafer processing and with reduced manufacturing cost.

SUMMARY

Embodiments generally relate to semiconductor device and methods for forming a semiconductor device. In one embodiment, a method of forming a semiconductor device is presented. The method includes providing a substrate having top and bottom pad stacks. Each pad stack includes at least first and second pad layers. The second pad layer of the bottom pad stack is removed by a batch process. Trench isolation regions are formed in the substrate.

In another embodiment, a method of forming a device is disclosed. The method includes providing a wafer substrate having top and bottom pad stacks on top and bottom surfaces of the wafer substrate respectively. Each pad stack includes at least first and second pad layers. The second pad layer is provided over the first pad layer. A protective layer is formed over a top surface of the top pad stack. The second pad layer of the bottom pad stack is removed by a batch process after forming the protective layer. Trench isolation regions are formed in the substrate.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1 shows an exemplary embodiment of a device; and

FIGS. 2a-2g show an embodiment of a process for forming a device.

DETAILED DESCRIPTION

Figure 2A:
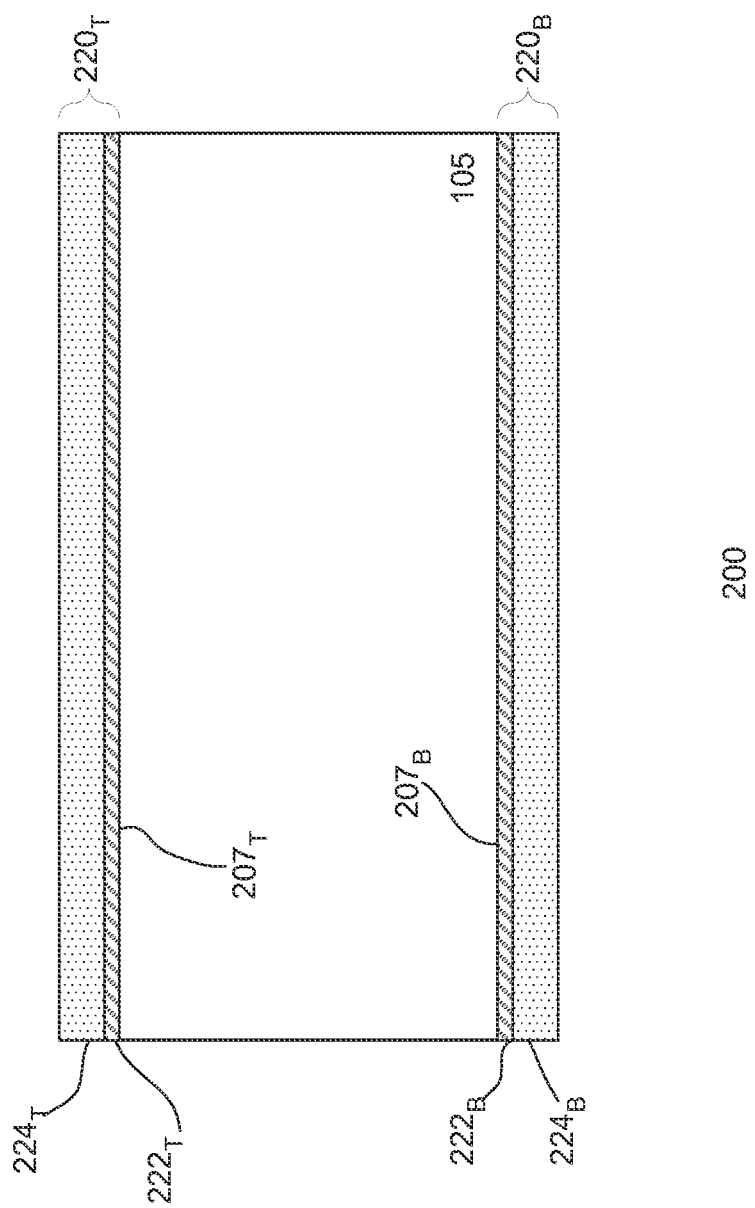

Embodiments generally relate to semiconductor devices or integrated circuits (ICs). More particularly, some embodiments relate to wafer processing in forming devices. For example, the devices may be any type of devices. The devices or ICs can be incorporated into or used with, for example, consumer electronic products, such as cell phones, laptop computers and personal digital assistants (PDAs).

FIG. 1 shows a cross-sectional view of a portion of an exemplary embodiment of a device 100. The device, for example, is an IC. Other types of devices may also be useful. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate maybe a doped substrate. For example, the substrate can be lightly doped with p-type dopants. Providing a substrate with other types of dopants or dopant concentrations as well as an undoped substrate, may also be useful.

The device may include doped regions having different dopant concentrations. For example, the device may include heavily doped ($x^+$), intermediately doped ($x$) and lightly doped ($x^-$) regions, where x is the polarity type which can be p or n. A lightly doped region may have a dopant concentration of about $1E11$-$1E13/cm^3$, an intermediately doped region may have a dopant concentration of about $1E13$-$E14/cm^3$, and a heavily doped region may have a dopant concentration of about $1E14$-$1E17/cm^3$. Providing other dopant concentrations for the different doped regions may also be useful. P-type dopants may include boron (B), aluminum (Al), indium (In) or a combination thereof, while n-type dopants may include phosphorous (P), arsenic (As), antimony (Sb) or a combination thereof.

The substrate includes a device region. The device region includes a transistor. As shown, the transistor is a LD transistor 120. Providing other types of transistors or devices in the device region may also be useful. The substrate may also include regions for other types of circuitry, depending on the type of device or IC.

Isolation regions may be provided for isolating or separating different regions of the substrate. In one embodiment, the device region is isolated from other regions by a device isolation region 180. For example, the device isolation region surrounds the device region. The isolation region, for example, is a shallow trench isolation (STI) region. An STI region includes an isolation trench filled with isolation or dielectric materials. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

The transistor includes a gate 140 disposed on the surface of the substrate. The gate, for example, traverses the device region along the z direction. The width of the gate along a channel length direction of the transistor may be about 0.1-50 μm. As shown, the channel direction is in the x direction. The x and z directions, for example, are orthogonal directions. The gate, in one embodiment, includes a gate electrode 144 over a gate dielectric 142. The gate dielectric, for example, may be silicon oxide while the gate electrode may be polysilicon. The gate dielectric, for example, may be a high voltage gate dielectric having a thickness of about 60-1000 Å while the gate electrode may be about 700-5000 Å thick. In some embodiments, the gate electrode may be a doped electrode. For example, the gate electrode may be polysilicon doped with first polarity type dopants. Other types of gate dielectrics and gate electrodes as well as thicknesses may also be useful. For example, the gate dielectric may be a high k gate dielectric and/or the gate electrode may be a metal gate electrode. Other configurations of gate layers of the gate may also be useful.

The transistor also includes first and second doped regions 132 and 134 disposed in the substrate on first and second sides of the gate. For example, the first doped region is disposed on the first side of the gate and the second doped region is disposed on the second side of the gate. The doped regions, in one embodiment, are heavily doped with first polarity type dopants for a first type transistor. For example, the doped regions are heavily doped n-type $n^+$ regions for a n-type transistor. Providing heavily doped p-type ($p^+$) regions may also be useful for a p-type transistor. The heavily doped regions, for example, have a dopant concentration of about 1E15-1E16/cm$^3$. Other dopant concentrations for the doped regions may also be useful. The depth of the doped regions may be about 0.1-0.4 μm. Providing doped regions having other depths may also be useful. Additionally, it is not necessary that the first and second doped regions have the same depth.

In one embodiment, the first doped region serves as a source region of the transistor. The source region is adjacent to the first side and underlaps the gate. The underlap portion should be sufficient for the source region to be in communication with the channel under the gate. The underlap portion may be, for example, about 0.1-0.3 μm. An underlap portion which underlaps the gate by other amounts may also be useful. In one embodiment, the underlap portion of the source region is a lightly doped (LD) region.

Sidewalls of the gate may be provided with dielectric spacers 148. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer and main spacer. The offset spacers may facilitate forming the LD region while the main spacers facilitate forming heavily doped source and drain regions. Other configurations of spacers may also be useful. For example, the spacer may be a single spacer. The LD region is formed prior to forming the spacers while the spacers facilitate forming the heavily doped source and drain regions. In some cases, the transistor may include a halo region. The halo region is a second polarity doped region abutting the source region proximate to the gate.

In one embodiment, an internal isolation region 187 is provided within the device region. The internal isolation region may be an STI region. Other types of isolation regions may also be useful. Preferably, the internal isolation region is the same type of isolation region as the device isolation region. Providing an internal isolation region which is different from the device isolation region may also be useful. The internal isolation region, for example, is disposed in the device region along the z direction between the gate and drain. The internal isolation region, for example, extends from one side to the other side of the device region along the z direction. Other configurations of the device and internal isolation region may also be useful. As shown, the internal isolation region underlaps the gate. For example, the internal isolation region extends under the second side of the gate by about 0.1-2 μm. Providing an internal isolation region which extends under the second side of the gate by other widths may also be useful. Providing the internal isolation region which underlaps the gate protects the edge of the gate dielectric from high electric field during operation. The width of the internal isolation region, for example, may be about 0.5-10 μm. Other widths may also be useful, depending on the drain voltage.

The width and depth of the internal isolation region may determine a drift length of the transistor.

A drift well 150 is disposed in the substrate. The drift well, in one embodiment, is disposed in the device region. For example, the drift well is disposed between the gate and the drain region, under-lapping a portion of the gate. As shown, the drift well encompasses the drain and the internal device isolation region. In one embodiment, the depth or bottom of the drift well is below the drain region. In one embodiment, the depth or bottom of the drift well is below the device isolation and internal device isolation regions. In one embodiment, the drift well is contiguous and encompasses the drain region and at least overlaps a portion of the active region underneath the gate. The distance from the drain and around the internal isolation region to the channel under the gate is the drift distance of the transistor.

The drift well includes first polarity type dopants. In one embodiment, the dopant concentration of the drift well is lower than the dopant concentration of the drain. In one embodiment, the drift well may be lightly ($x^-$) or intermediately (x) doped with first polarity type dopants. For example, the dopant concentration of the drift well is about 1E12-1E14/cm$^2$. Other dopant concentrations may also be useful. For example, the dopant concentration may depend on the maximum or breakdown voltage requirement of the device. The depth of the drift well may be about 0.5-5 μm depending on the design voltage of the device.

A device well 170 is disposed in the substrate. In one embodiment, the device well is disposed within the device isolation region. For example, the device well is disposed within the device isolation region, encompassing the source, drain, drift well and internal device isolation region. In one embodiment, the depth or bottom of the device well is below the source, drain and drift well. In one embodiment, the depth or bottom of the device well is below the device isolation region and internal device isolation region. Providing a device well which is shallower than or at the same depth as the drift well may also be useful. In one embodiment, the device well has about the same depth as the drift well. For example, the device well may be on both sides of the drift well. Other configurations of the device and drift well may also be useful. For example, the device well may only be on one side of the drift well encompassing the source region and channel of the device.

The device well includes second polarity type dopants for a first polarity type device. For example, the device well comprises p-type dopants for an n-type device or n-type dopants for a p-type device. The dopant concentration may depend on the voltage requirement of the device. The device well may be lightly ($x^-$) or intermediately (x) doped with second polarity type dopants. Other dopant concentrations for the device well, for example, dopant concentrations greater than that of the lightly doped substrate, may also be useful.

Metal silicide contacts 128 may be provided on terminals or contact regions of the transistor. For example, metal silicide contacts may be provided on the gate electrode, source and drain. The silicide contacts, for example, may be nickel-based silicide contacts. Other types of metal silicide contacts may also be useful. For example, the metal silicide contact may be cobalt silicide (CoSi). The silicide contacts may be about 50-300 Å thick. Other thickness of silicide contacts may also be useful. The silicide contacts may be employed to reduce contact resistance and facilitate contact to the back-end-of-line metal interconnects.

A dielectric layer 190 is disposed on the substrate, covering the transistor. The dielectric layer, in one embodiment, serves as a pre-metal dielectric (PMD) layer. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG).

The PMD layer includes contacts to contact regions of the transistor. For example, contacts plugs 194 are provided in the PMD layer to the gate electrode, source and drain. The contact plugs, for example, may be tungsten contact plugs. Other types of conductive contact plugs may also be useful.

An inter-metal dielectric (IMD) layer (not shown) may be provided over the PMD layer. The IMD layer, for example, may be silicon oxide. Other types of IMD dielectric materials may also be useful. An etch stop layer may be provided between the IMD and PMD layers. The IMD layer may include conductive lines disposed in the IMD layer which interconnect to the contact plugs. Other configurations of IMD and PMD layers may also be useful. Additional metal layers may be provided to provide interconnections to the various components of the IC.

FIGS. 2a-2g show cross-sectional views of an embodiment of a process for forming a device 200. The device, for example, is similar to that described in FIG. 1. Forming other types of devices may also be useful. Referring to FIG. 2a, a substrate 105 is provided. The substrate, in one embodiment, is a semiconductor wafer, such as a silicon wafer. The wafer may be a doped wafer, such as a p⁻ substrate. Other types of substrates, such as a germanium-based, gallium arsenide, sapphire, or COI such as SOI, may also be useful. The wafer may be doped with other types of dopants or dopant concentrations, including undoped wafers. The wafer, for example, is processed to form a plurality of dies or chips in parallel. The wafer is then diced to singulate the dies.

As shown in FIG. 2a, the substrate is at the initial stage of processing. In one embodiment, the substrate is provided with top and bottom pad stacks $220_T$ and $220_B$ on top and bottom surfaces of the wafer. The top surface $207_T$ may be referred to as the frontside and the bottom surface $207_B$ may be referred to as the backside. A pad stack includes first and second pad layers 222 and 224. The first pad layer is disposed on the substrate while the second pad layer is disposed on the first pad layer. Providing a pad stack with more than two layers may also be useful. In one embodiment, the first pad layer is a pad silicon oxide layer and the second pad layer is a pad silicon nitride layer. The pad oxide, for example may be about 100-300 Å thick while the pad nitride is about 1000-2000 Å thick. Other thicknesses or types of pad layers may also be useful. In one embodiment the pad layers are formed by thermal processes, such as batch furnace processes. Forming the pad layer using other processes may also be useful.

Figure 2B:
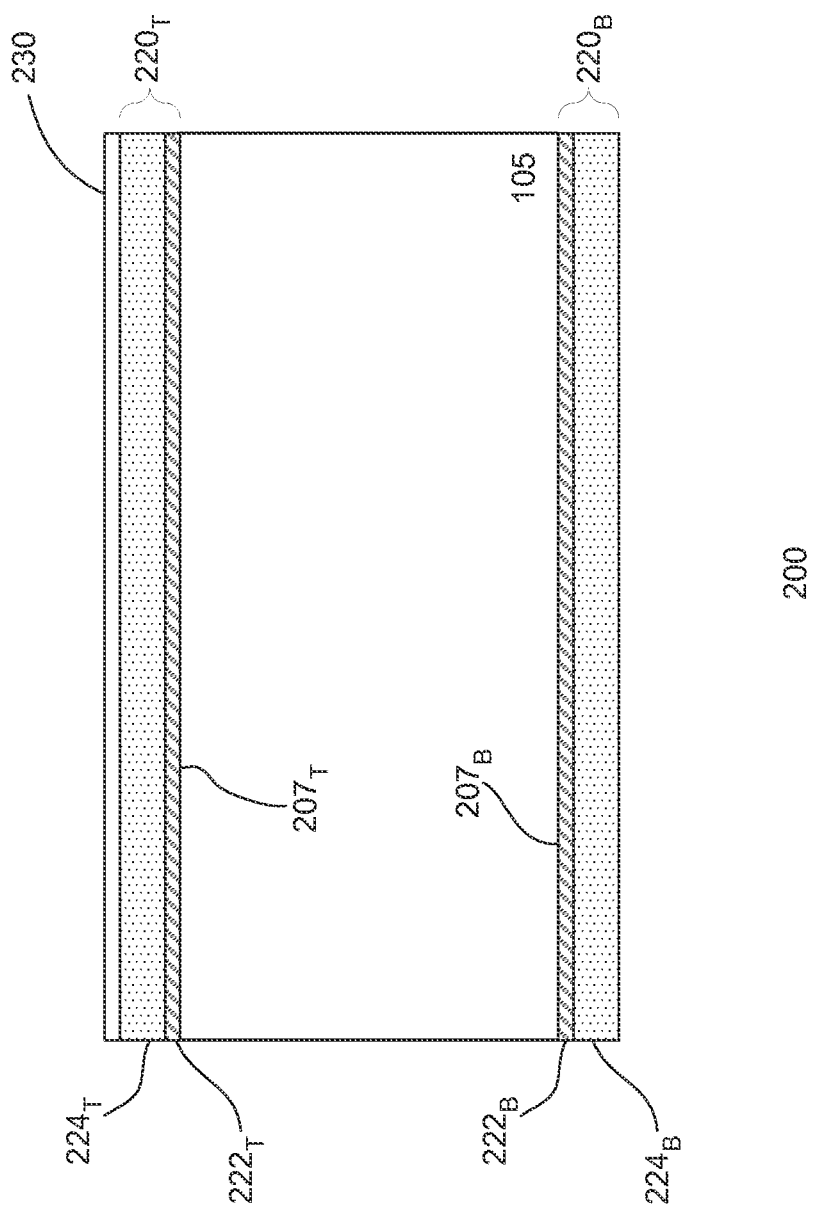

Referring to FIG. 2b, a protective layer 230 is disposed on a top surface of one of the pad stacks. In one embodiment, the protective layer is disposed on the top surface of the frontside pad stack. For example, the protective layer is disposed on the pad nitride layer $224_T$ on the frontside pad stack. In a preferred embodiment, the protective layer can be removed selective to the top layer of the pad stack. For example, the protective layer can be removed selective to the pad nitride layer. In a preferred embodiment, the protective layer can be removed along with the pad layer below the top pad layer. For example, the protective layer can be removed along with the pad oxide layer. Preferably, the protective layer can be removed by a batch wet processing along with the backside pad oxide layer. Providing a protective layer which is not removed along with pad oxide may also be useful.

The protective layer, in one embodiment, is silicon oxide. Other types of protective layer may also be useful. The protective layer, for example, may be silicon oxide formed by chemical vapor deposition (CVD). In one embodiment, the silicon oxide protective layer is formed by plasma enhanced CVD (PECVD). Other techniques for forming the protective layer may also be useful. The thickness of the protective layer may be about the same as the first pad layer. For example, the protective layer is about 500 Å. Providing a protective layer with other thicknesses may also be useful.

In another embodiment, the protective layer is a photoresist layer. The thickness of the photoresist layer, for example, is about 0.5-2 μm. Other thickness ranges may also be useful.

Figure 2C:
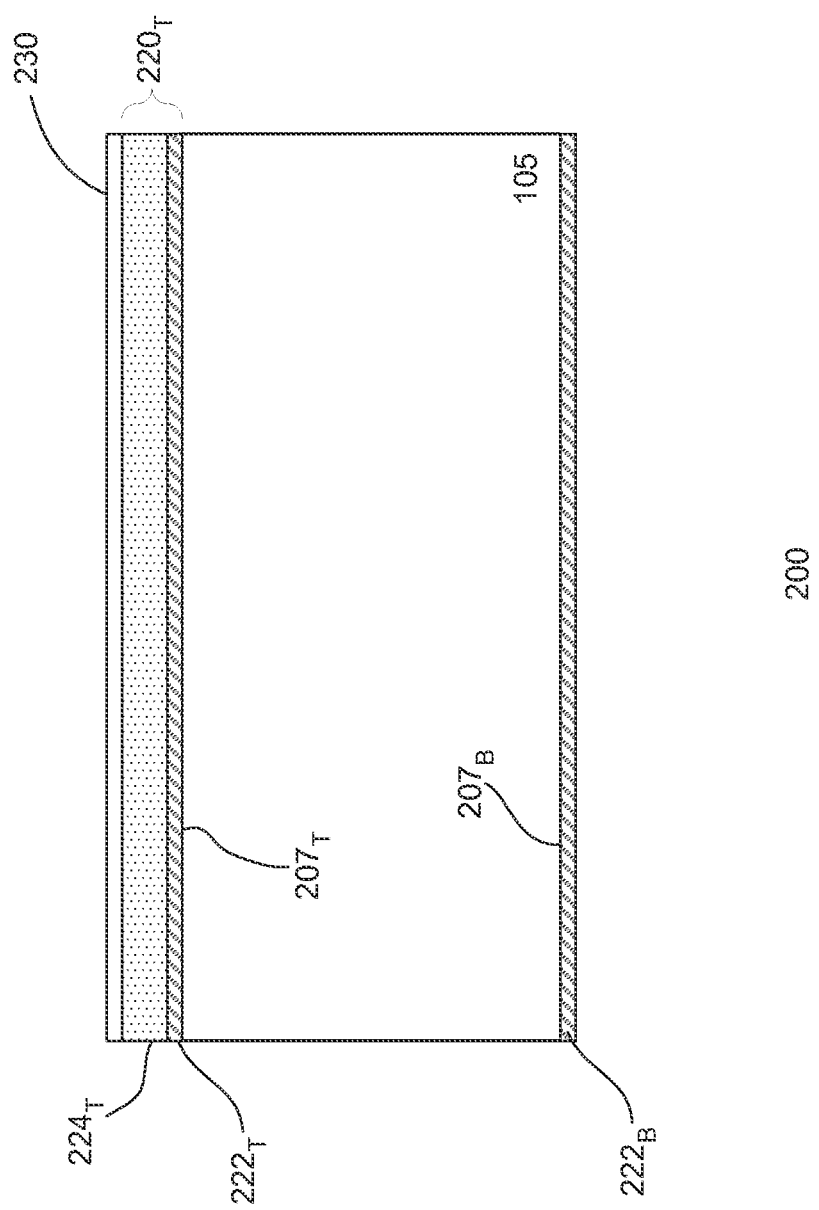

In FIG. 2c, the second pad layer $224_B$ of the backside pad stack is removed. In one embodiment, the pad nitride of the backside pad stack is removed. The pad nitride, for example is removed by a wet etch process. In one embodiment, the pad nitride is removed by a batch wet etch process or wet bench process. The batch wet etch process used for removing the pad nitride includes the use of, for example, hot phosphoric acid $H_3PO_4$. Other suitable types of etch chemistry may also be employed for the batch wet etch process. The protective layer protects the pad nitride layer $224_T$ of the frontside pad stack. This preserves the integrity of the frontside pad stack while the backside pad nitride $224_B$ is removed.

Referring to FIG. 2d, the protective layer is removed. For the case where the protective layer can be removed along with the backside pad oxide layer $222_B$, both layers are removed. For example, a wet etch is employed to remove the protective and backside pad oxide layers. In one embodiment, the protective and backside pad oxide layers are removed by a batch wet etch process. The batch wet etch process used for removing the protective and backside pad oxide layers includes the use of, for example, HF. Other suitable types of etch chemistry may also be employed for the batch wet etch process. In the case where the backside pad oxide layer $222_B$ is not removed along with the protective layer, it can be removed separately. For example, the backside pad oxide layer is removed by a wet etch while the protective layer, such as the photoresist layer, is removed by a plasma ashing process. The backside pad oxide layer, for example, may be removed prior to the removal of the photoresist layer.

Figure 2E:
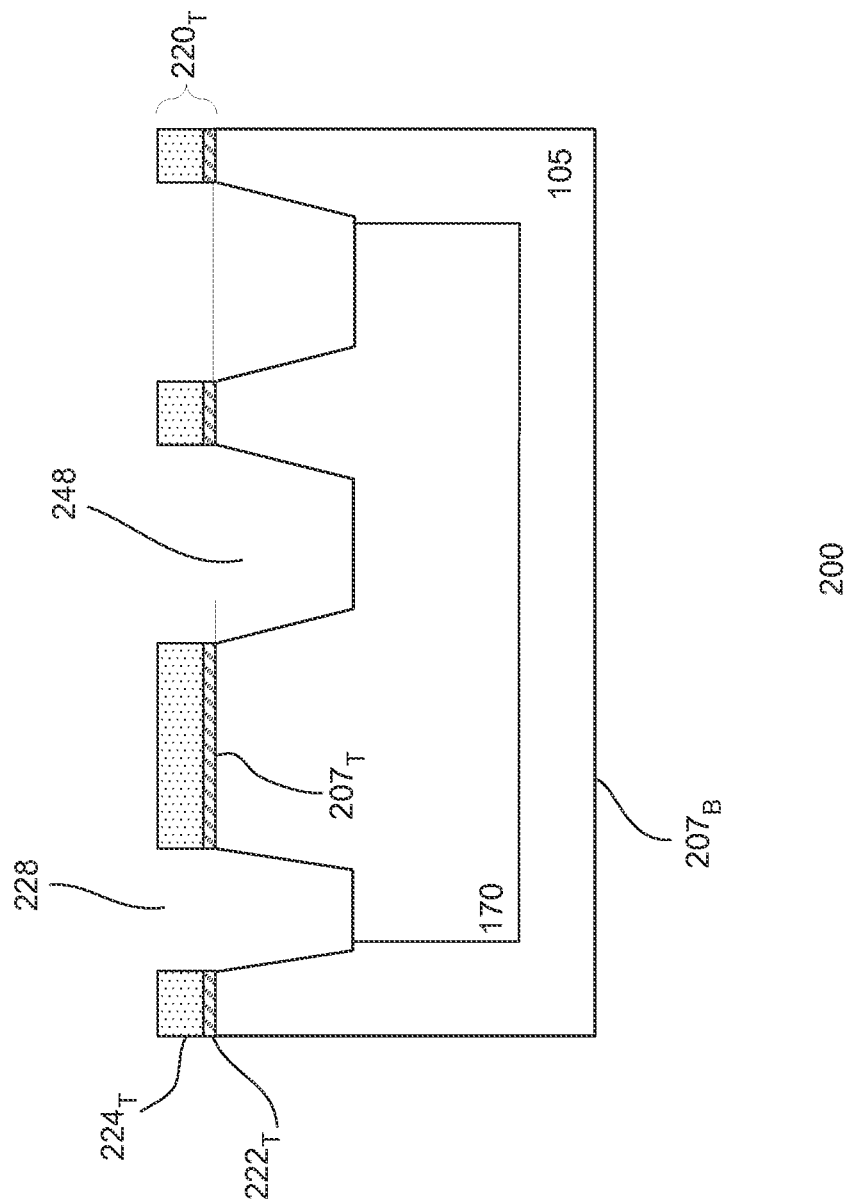

Referring to FIG. 2e, after removing the protective layer, the frontside pad stack is patterned. The frontside pad stack $220_T$ is patterned by, for example, mask and etch techniques. Patterning of the frontside pad stack may be achieved using etch and mask techniques. For example, a RIE is employed using a patterned soft mask, such as photoresist, as an etch mask. To improve lithographic resolution, an ARC can be provided beneath the photoresist. Other techniques for patterning the pad stack may also be useful.

The patterned pad stack is used to pattern the substrate to form trenches 228 and 248. In one embodiment, the trenches are used to form isolation regions. For example, the trenches are used to form STI regions. Forming other types of trench isolation regions may also be useful. Providing the trenches for other purposes may also be useful.

After the trenches are formed, a doped device well 170 may be formed. For example, the doped device well may be formed by implanting dopants into the substrate. Although one device well is formed, it is understood that multiple device wells may be formed. Device wells of different polarity types may be formed. The different polarity type device wells may be formed by multiple implant processes, for example, using different implant masks, such as photoresist masks. High voltage devices, such as LDMOS, require deeper well to sustain high voltage. A high temperature and long thermal drive in process is performed after formation of the device well.

Figure 2F:
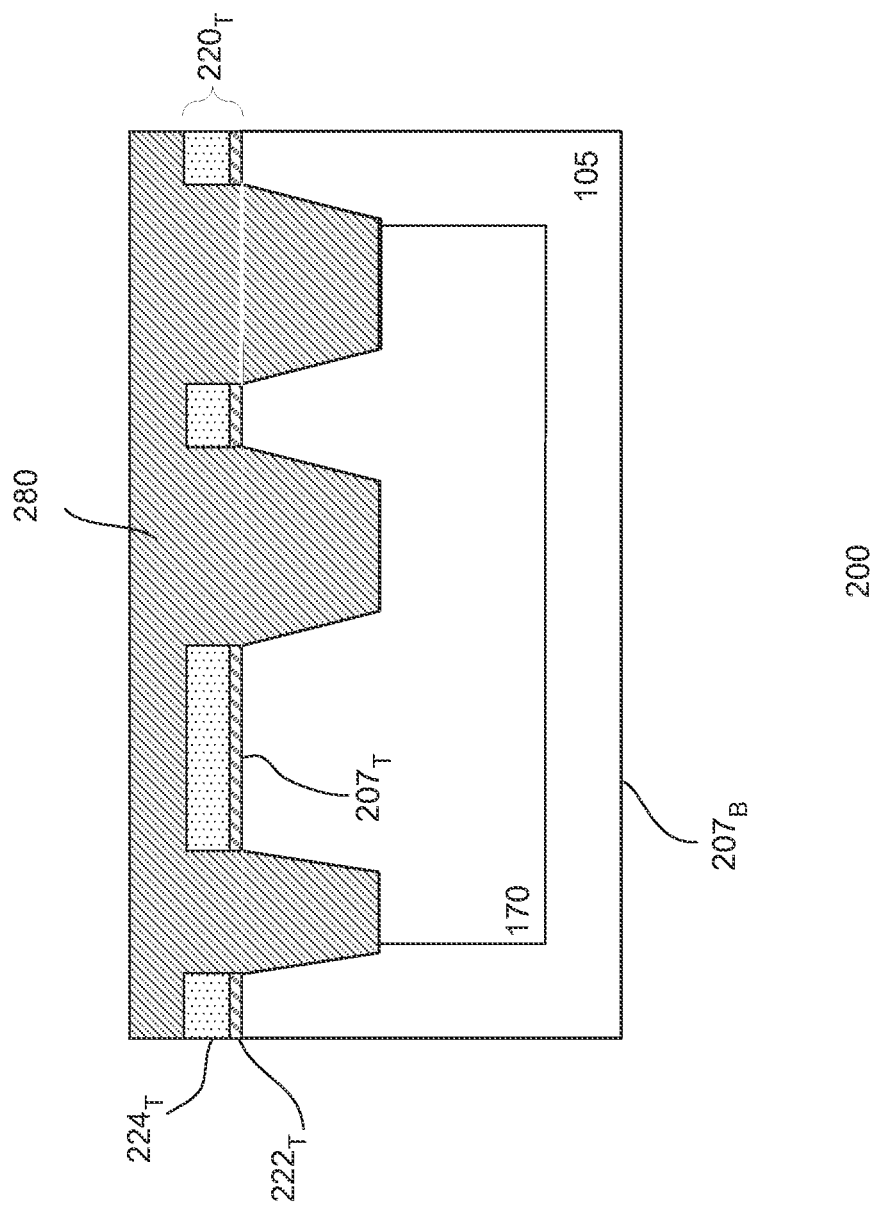
Figure 2G:
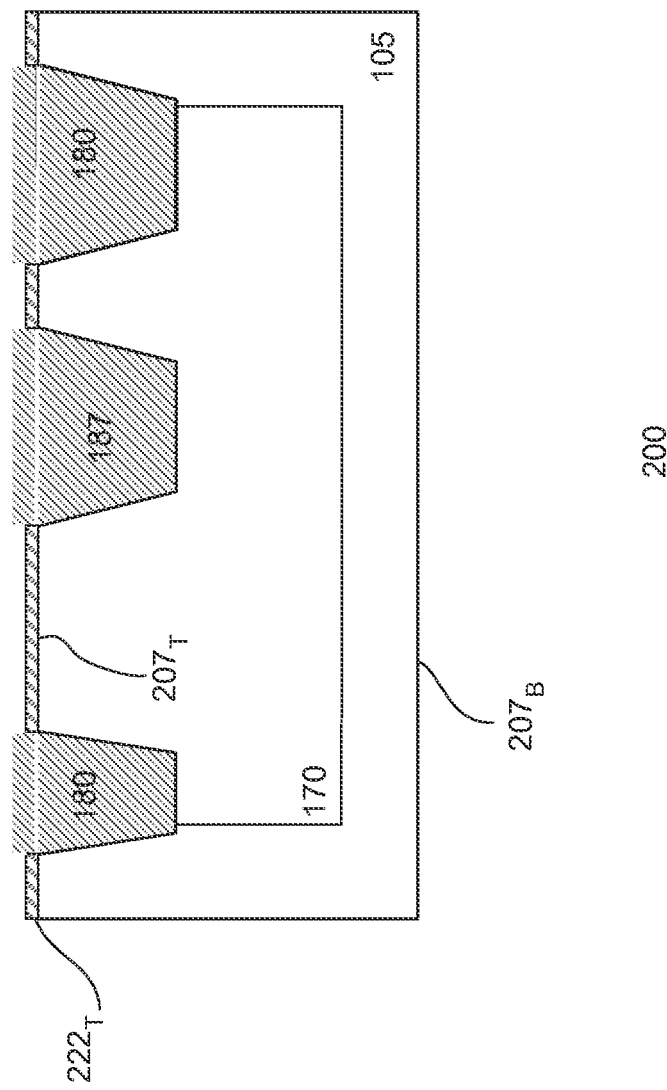

Referring to FIG. 2f, a dielectric layer 280, such as silicon oxide, is formed on the substrate, covering the frontside of the pad stack and filling the trenches. The thickness of the dielectric layer is sufficient to completely fill the trenches. Chemical mechanical polishing (CMP) can be performed to remove excess oxide and provide a planar substrate top surface. The CMP also removes part or portion of the frontside pad stack. The process may continue by removing the remaining portion of the frontside pad nitride layer by a wet etch process to form the STI regions 180 and 187 as shown in FIG. 2g. The wet etch process, for example, may employ the same etch solution as described in FIG. 2c. The wet etch process removes the remaining frontside pad nitride layer to expose the frontside pad oxide layers $222_T$. Other suitable techniques may also be used to remove the remaining portion of the frontside pad nitride layer. In one embodiment, a stripping process may be performed to remove the remaining pad oxide layer over the frontside of the wafer substrate to expose the substrate frontside $207_T$ and an oxide growth process (not shown) may be performed subsequently to form a sacrificial oxide layer (not shown) for well implant to form device wells. The sacrificial oxide layer (not shown) protects the substrate from implant damage. The pad oxide layer $222_T$, for example, may be removed by a wet etch process, such as HF. Other suitable techniques may also be employed to remove the remaining pad oxide layer. In another embodiment, the remaining pad oxide layer may not be removed and therefore remain for well implant. Thus, the remaining pad oxide layer may serve as the sacrificial oxide layer.

After forming the STI regions, the process continues to form transistors, such as that described in FIG. 1. Forming other types of components may also be useful. The process continues until processing of the wafer is completed. For example, interconnect levels, passivation, dicing the wafer into individual chips, testing and packaging may be performed.

The process, as described with respect to FIGS. 2a-2g, results in advantages. For example, the use of the protective layer allows for batch processing to remove the pad nitride layer. The total processing time to remove the pad nitride layer having thickness of about 1500 Å, for example, is about 25 mins. Moreover, the process uses existing tool set and does not require additional special backside cleaning tool. As such, the process provides for a low cost, time savings and high throughput solution. Furthermore, flipping of the wafer to remove the backside pad nitride may be difficult for large size wafers, such as the 300 mm or 450 mm wafers. The process as described does not have such concern or avoids such problem since flipping of the wafer is not required.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate having top and bottom sides;
providing a top pad stack on the top side of the substrate and a bottom pad stack on the bottom side of the substrate, wherein each pad stack comprises at least first and second pad layers;
forming a protective layer only over a top surface of the top pad stack;
removing the second pad layer of the bottom pad stack by a batch process, wherein the entire protective layer remains over the top pad stack and protects the top pad stack during removing of the second pad layer of the bottom pad stack;
removing the entire protective layer from the top surface of the top pad stack after removing the second pad layer of the bottom pad stack and prior to forming trenches;
forming the trenches in the substrate, wherein forming the trenches comprises
patterning the top pad stack using mask and etch techniques after removing the entire protective layer from the top surface of the top pad stack, and
patterning the substrate to form the trenches using the patterned top pad stack; and
forming isolation regions in the trenches.

2. The method of claim 1 wherein the first pad layer comprises silicon oxide and the second pad layer comprises silicon nitride.

3. The method of claim 1 wherein the second pad layer is over the first pad layer.

4. The method of claim 3 wherein the protective layer is formed over and contacts a top surface of the second pad layer of the top pad stack.

5. The method of claim 4 wherein the protective layer comprises a material which can be removed selective to the second pad layer.

6. The method of claim 4 wherein the protective layer is formed by chemical vapor deposition (CVD) process.

7. The method of claim 6 wherein the CVD process comprises plasma enhanced CVD.

8. The method of claim 1 wherein the protective layer comprises the same material as the first pad layers of the pad stacks.

9. The method of claim 8 wherein the protective layer and the first pad layers of the pad stacks comprise silicon oxide.

10. The method of claim 8 wherein the second pad layer of the bottom pad stack is removed by a batch wet etch process.

11. The method of claim 8 wherein the entire protective layer and the first pad layer of the bottom stack are removed simultaneously after removing the second pad layer of the bottom pad stack.

12. The method of claim 11 wherein the protective layer and the first pad layer of the bottom pad stack are removed by a batch wet etch process.

13. The method of claim 1 wherein the protective layer comprises a photoresist layer.

14. The method of claim 13 wherein the entire protective layer and the first pad layer of the bottom pad stack are removed by separate processes after removing the second pad layer of the bottom pad stack.

15. The method of claim 14 wherein the protective layer is removed by a plasma ashing process.

16. A method of forming a device comprising:
providing a wafer substrate having top and bottom pad stacks on top and bottom surfaces of the wafer substrate respectively, wherein each pad stack comprises at least first and second pad layers, and the second pad layer is provided over the first pad layer;

forming a protective layer only over a top surface of the top pad stack;

removing the second pad layer of the bottom pad stack by a batch process after forming the protective layer, wherein the entire protective layer remains and protects the top pad stack during removing of the second pad layer of the bottom pad stack;

removing the entire protective layer from the top surface of the top pad stack after removing the second pad layer of the bottom pad stack and prior to forming trenches;

forming the trenches in the substrate, wherein forming the trenches comprises patterning the top pad stack using mask and etch techniques after removing the entire protective layer from the top surface of the top pad stack, and patterning the substrate to form the trenches using the patterned top pad stack; and forming isolation regions in the trenches.

17. The method of claim 16 wherein the protective layer comprises the same material as the first pad layer.

18. The method of claim 16 wherein the protective layer and the first pad layer of the pad stacks comprise silicon oxide.

19. The method of claim 16 wherein the protective layer comprises a photoresist layer.

\* \* \* \* \*